United States Patent [19]

Ochi

[11] Patent Number: 5,059,910
[45] Date of Patent: Oct. 22, 1991

[54] OPTICAL TRANSFORMER

[75] Inventor: Naoki Ochi, Amagasaki City, Japan

[73] Assignee: Mitsubishi Denki Kabushiki Kaisha, Japan

[21] Appl. No.: 571,978

[22] Filed: Aug. 24, 1990

[30] Foreign Application Priority Data

Aug. 25, 1989 [JP] Japan .................................. 1-217474

[51] Int. Cl.$^5$ .................................................. G01R 31/02
[52] U.S. Cl. ......................................... 324/537; 324/72
[58] Field of Search ............... 324/537, 514, 536, 551, 324/552, 553, 522, 523, 530, 127, 543, 72

[56] References Cited

U.S. PATENT DOCUMENTS

| | | | |
|---|---|---|---|
| 3,590,374 | 6/1971 | Evans et al. | 324/127 X |
| 3,869,665 | 3/1975 | Kenmochi et al. | 324/536 X |
| 4,025,845 | 4/1977 | Lhommelet et al. | 324/537 |
| 4,384,248 | 5/1983 | Matsuda et al. | 324/537 |
| 4,549,132 | 11/1985 | Yamigawa et al. | 324/536 X |

Primary Examiner—Kenneth A. Wieder
Assistant Examiner—Robert W. Mueller
Attorney, Agent, or Firm—Leydig, Voit & Mayer

[57] ABSTRACT

An optical transformer comprises at least two potential dividing capacitors connected in series to each other are connected between a high-voltage conductor and an intermediate electrode or between the intermediate electrode and the ground, and optical voltage sensors connected in parallel to the respective potential dividing capacitors and capable of modulating light in accordance with voltage. In another form, the optical transformer has a single potential dividing capacitor connected between a high-voltage conductor and an intermediate electrode or between the intermediate electrode and the ground, and at least two circuits connected in parallel with the potential dividing capacitor, each circuit including a series the connection of an optical voltage sensor for modulating light in accordance with the voltage and a resistor or an impedance.

9 Claims, 4 Drawing Sheets

OPTICAL TRANSFORMER

BACKGROUND OF THE INVENTION

1. Field of the Invention

The present invention relates to an optical transformer, capable of optically measuring voltages of components which are charged to high voltages, e.g., components of a power sub-station.

2. Description of the Related Art

Hitherto, an optical transformer has been proposed in which a voltage applied to a high-voltage conductor is potential-divided and thus divided voltage is applied to an electro-optical element. FIG. 1 shows a conventional optical transformer, used in a tubular gas-insulated electrical device. A high-voltage conductor 2 as a line conductor is received in a tubular metallic vessel 1, and an intermediate electrode 3 is disposed between the metallic vessel 1 and the high-voltage conductor 2. The potential of the intermediate electrode 3 is transmitted to the exterior of the metallic vessel 1 through a sealed terminal 4 which is electrically insulated from the metallic vessel 1. A main capacitor 5 is formed by a drifting capacitance between the high-voltage capacitor 2 and the intermediate electrode 3. A capacitance 6 is a drifting capacitance formed between the intermediate electrode 3 and the metallic vessel 1. In order to optimumly adjust the divided potential of the intermediate electrode 3, a capacitor 7 is connected between the intermediate electrode 3 and the earth, in parallel with the drifting electrostatic capacitance 6. The metallic vessel 1 is charged with an insulating gas 8, in order to enhance the insulation between the high-voltage conductor 2 and the metallic vessel 1.

The voltage between the intermediate electrode 3 and the ground is applied to an optical voltage sensor 10 through lead lines 9. A signal processing circuit 12, which is connected to the photoelectric sensor 10 by means of an optical fiber 11, transmits and receives light to and from the photoelectric sensor 10. The light from the optical voltage sensor 10 has an intensity modulated in proportion to a voltage applied to the optical voltage sensor 10. The signal processing circuit 12 converts the intensity-modulated light to a required electrtical amount.

FIG. 2 shows a circuit which is equivalent to that shown in FIG. 1. A capacitor 13 is a potential-dividing capacitor composed of the drifting electrostatic capacitance 6 and the capacitor 7.

When a voltage is applied to a high-voltage conductor 2, the voltage or potential of the intermediate electrode 3 is determined by the potential division performed by the main capacitor 5 and the potential-dividing capacitor 13, and this voltage is applied to the optical voltage sensor 10. Consequently, a voltage proportional to the voltage of the high-voltage conductor 2 is applied to the optical voltage sensor 10. The signal processing circuit 12 transmits light to the optical voltage sensor 10 through the optical fiber 11, and receives the light modulated by the optical voltage sensor 10 again through the optical fiber 11. In this state, the optical voltage sensor 10 modulates the light in proportion to the voltage applied thereto. It is therefore possible to measure the voltage of the high-voltage conductor 2, by processing the light signal by means of the signal processing circuit 12.

According to this arrangement, it is impossible to obtain an exact output when a trouble exists in the optical voltage sensor 10, optical fiber 11 or the signal processing circuit 12. In such a case, a device connected to the output of the signal processing circuit 12, e.g., a relay (not shown), may operate erroneously. In order to avoid such an inconvenience, it has been proposed to employ a duplicate construction composed of optical voltage sensors 10a, 10b, optical fibers 11a, 11b and signal processing circuits 12a, 12b. In case of a trouble in one of the optical fibers 11a and 11b and the signal processing circuit 12a and 12b, a difference occurs between the outputs of the two signal processing circuits. It is possible to avoid erroneous operation of the relay or the like device by using, for example, a voltage balance relay or the like, by making use of the difference in the outputs. This arrangement is shown as a fault detection circuit 17 in FIG. 3. This fault detection circuit 17 monitors electrical signals representative of the voltages output from the signal processing circuits 12a, 12b and applied across the optical voltage sensors 10a, 10b and detects occurrence of a fault upon sensing any difference between these electrical signals. A similar fault detection function may be applied also to detect fault in the optical voltage sensor 10a or 10b.

In the conventional optical transformer having the construction shown in FIG. 3, the optical voltage sensors 10a and 10b are connected to the same potential dividing capacitor 13 in parallel with each other. Therefore, in the event of a short-circuit failure in one of the optical voltage sensors 10a and 10b, the voltage across the potential dividing capacitor 13 is reduced to zero, so that both signal processing circuits 12a, 12b produce outputs corresponding to zero voltage. It is therefore impossible to prevent erroneous operation of the relay on the basis of the difference between the outputs of both signal processing circuits 12a, 12b.

SUMMARY OF THE INVENTION

Accordingly, an object of the present invention is to provide an optical transformer, capable of producing a difference between the outputs from two or more signal processing circuits not only when a fault has taken place in at least one of the optical fiber and the signal processing circuits or a line cutting accident has taken place in the optical voltage sensors, but also when a short-circuit failure has taken place in one of the optical voltage sensors, thereby overcoming the above-described problem of the related art.

According to one aspect of the present invention, two or more series-connected potential dividing capacitors are connected in series to the main capacitor, and an optical voltage sensor is connected in parallel with each potential dividing capacitor.

According to a second aspect of the present invention, at least two optical voltage sensor circuits, each having an optical voltage sensor and an impedance element such as a resistor connected in series to an optical voltage sensor, are connected in parallel with a potential dividing capacitor.

In the arrangement according to the first aspect, when a short-circuit accident has taken place in one of a plurality of optical voltage sensors, a difference is produced between the outputs of at least two signal processing circuits connected to the optical voltage sensors, because two or more optical voltage sensors are connected in parallel with independent potential dividing capacitors respectively.

In the arrangement according to the second aspect, since an impedance element such as resistance is connected in series to the optical voltage sensor, the voltage across the single potential dividing capacitor is not reduced to zero, even when a short-circuit accident has taken place in the optical voltage sensor. Thus, a difference of output is produced between at least two signal processing circuits.

DESCRIPTION OF THE PREFERRED EMBODIMENTS

Figure 1:
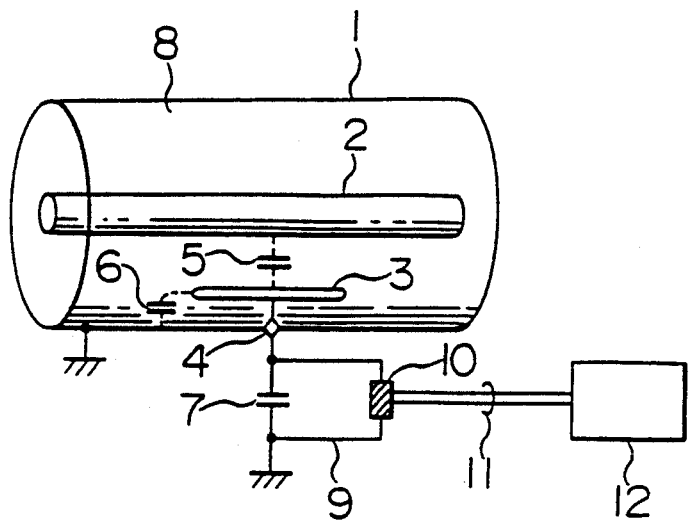
FIG. 1 is a schematic circuit diagram showing the construction of a conventional optical transformer.
Figure 2:
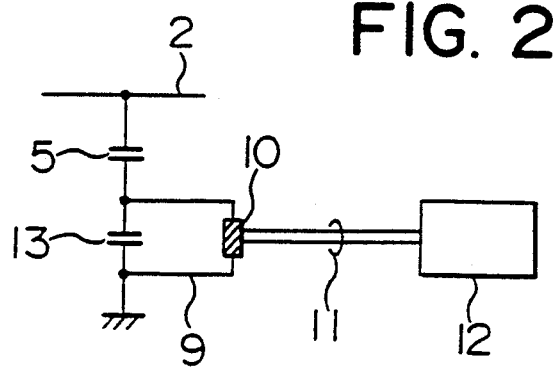
FIG. 2 is a circuit diagram of an equivalent circuit of the circuit shown in FIG. 1.
Figure 3:
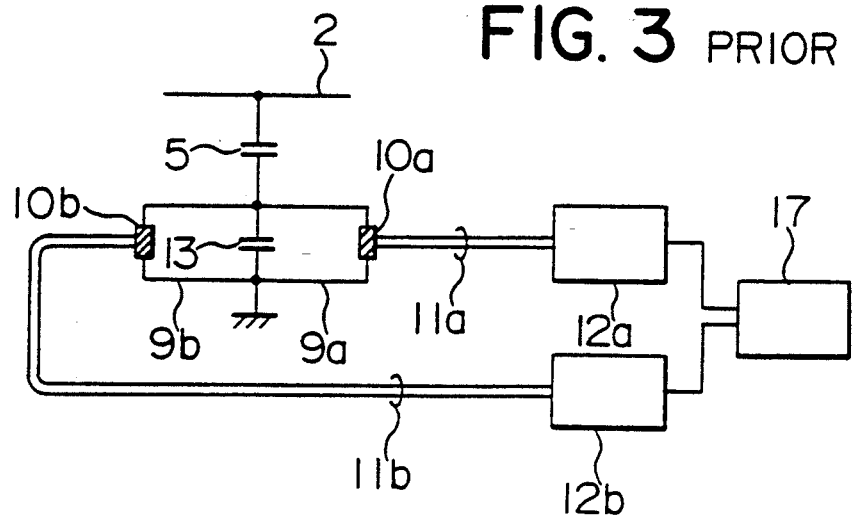
FIG. 3 is a schematic circuit diagram showing the construction of another conventional optical transformer.
Figure 4:
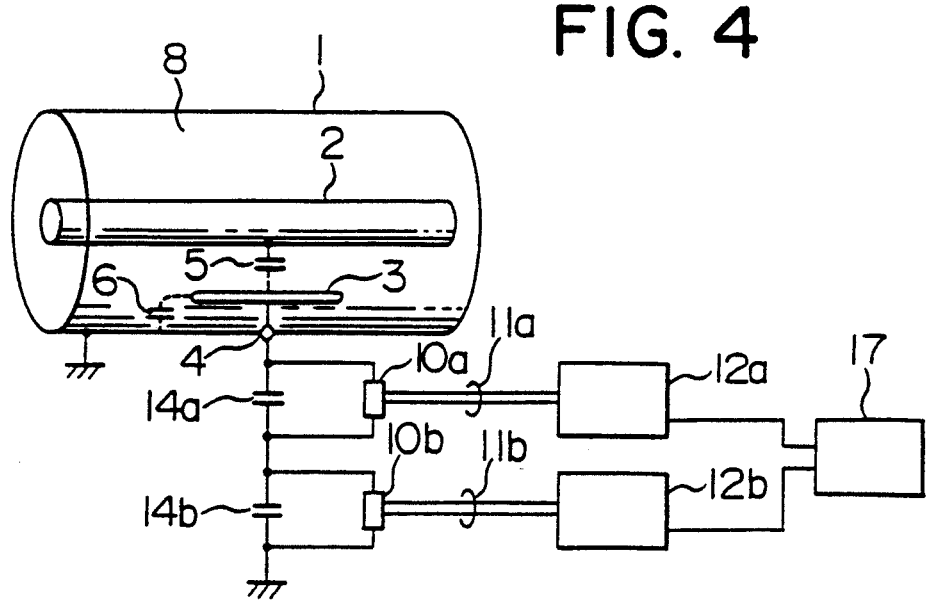
FIG. 4 is a schematic circuit diagram showing the construction of an embodiment of the optical transformer in accordance with the first aspect of the present invention.

An embodiment according to the first aspect of the present invention will be described with reference to FIGS. 4 and 5. Referring to FIG. 4, a first potential dividing capacitor 14a is connected in series to the main capacitor 5. A second potential dividing capacitor 14b is connected in series to the main capacitor 5 and the first potential dividing capacitor 14a. A first optical voltage sensor 10a is connected to the first potential dividing capacitor 14a in parallel therewith. Similarly, a second optical voltage sensor 10b is connected in parallel with the second potential dividing capacitor 14b. For instance, an optical voltage sensor 10a, optical fiber 11a and a signal processing circuit 12a form one set of optical voltage detecting means. Components bearing the same reference numerals as those in FIGS. 1 to 3 are the same as or equivalent to those components of the conventional optical transformers shown in FIGS. 1 to 3.

Figure 5:
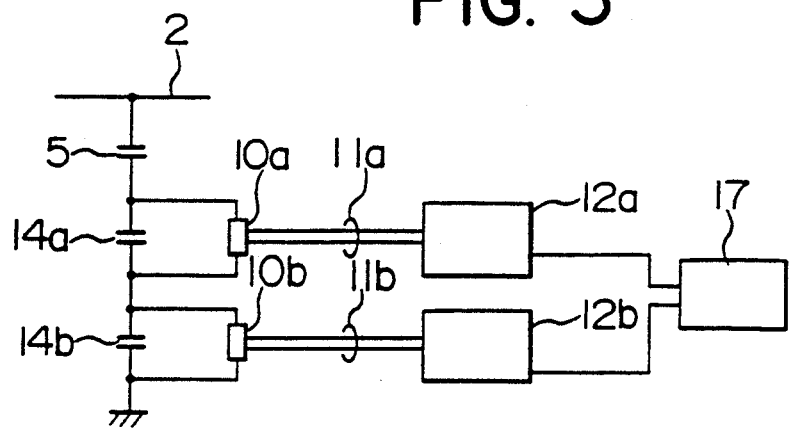
FIG. 5 is a circuit diagram of an equivalent circuit of the circuit shown in FIG. 4.

FIG. 5 shows an equivalent circuit of the circuit shown in FIG. 4. Since the drifting electrostatic capacitance 6 is generally small as compared with the capacitances of the potential dividing capacitors 14a, 14b, this drifting capacitance is omitted from FIG. 5.

The operation of this embodiment will be described with reference to FIG. 5. When a voltage $E_0$ is applied to the high-voltage conductor 2 as a line conductor, the voltages $E_a$ and $E_b$ across the optical voltage sensors 10a and 10b are respectively given by the following formulae.

$$E_a = \frac{E_0}{1 + \left(\frac{1}{Z_{c2}} + \frac{1}{Z_a}\right)\left(Z_{c1} + \frac{1}{\frac{1}{Z_{c3}} + \frac{1}{Z_b}}\right)}$$

$$E_b = \frac{E_0}{1 + \left(\frac{1}{Z_{c3}} + \frac{1}{Z_b}\right)\left(Z_{c1} + \frac{1}{\frac{1}{Z_{c2}} + \frac{1}{Z_a}}\right)}$$

where, $Z_{c1}$, $Z_{c2}$ and $Z_{c3}$ represent the impedances of the main capacitor 5, potential dividing capacitor 14a and the potential dividing capacitor 14b. Symbols $Z_a$ and $Z_b$ are self impedances of the optical voltage sensors 10a and 10b.

The formulae shown above can be simplified as shown below, since a condition of $Z_a$, $Z_b < < Z_{c2}$, $Z_{c3}$ is generally met.

$$E_a = \frac{Z_{c2}}{Z_{c1} + Z_{c2} + Z_{c3}} E_0$$

$$E_b = \frac{Z_{c3}}{Z_{c1} + Z_{c2} + Z_{c3}} E_0$$

It is assumed here that a short-circuit failure has taken place so as to reduce the voltage across the optical voltage sensor 10a to zero. In this case, the voltages $E_{a0}$, $E_{b0}$ are respectively represented as follows.

$$E_{a0} = 0$$

$$E_{b0} = \frac{Z_{c3}}{Z_{c1} + Z_{c3}} E_0$$

Consequently, the signal processing circuits 12a and 12b produce outputs of levels corresponding to the voltages $E_{a0}$ and $E_{b0}$, thus creating a difference between the levels of outputs.

In the case of an optical transformer in which the potential dividing ratio is set to be $Z_{c1}:Z_{c2}:Z_{c3}=3000:1:1$, the ratio of change in voltage $E_{b0}/E_b$ of change in voltage across the optical voltage sensor 10b caused by the short circuit failure is as small as about 0.03%. Therefore, an additional advantage is obtained in that a measurement is possible with a high degree of precision even when a fault has taken place in the optical voltage sensor 10a, by making use of the output from the optical voltage sensor 10b.

Although the above embodiment has been described with reference to the case where a short circuit accident has taken place in the optical voltage sensor 10a. However, it will be clear to those skilled in the art that a difference between the outputs of two signal processing circuits is generated also when the failure has taken place in the optical voltage sensor 10b, potential dividing capacitor 14a or the potential dividing capacitor 14b.

Figure 6:
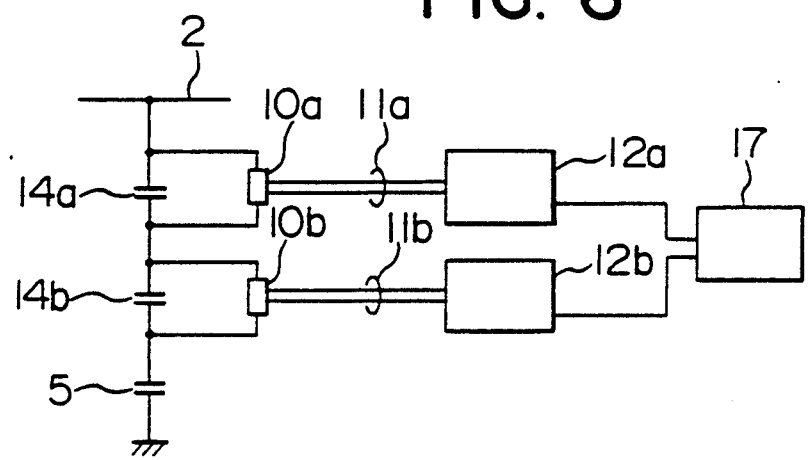
FIG. 6 is a schematic circuit diagram showing the construction of another embodiment of the optical transformer in accordance with the first aspect of the present invention.

In the embodiment described hereinbefore, the potential dividing capacitors are grounded. This, however, is only illustrative and the same advantages are obtained when the potential dividing capacitors may be connected to the high-voltage conductor, i.e., when the potential dividing capacitors are connected between the intermediate electrode 3 and the high-voltage conductor 2 as shown in FIG. 6.

The same advantages are also obtained when three or more optical voltage detection circuits, each including a potential dividing capacitor, an optical voltage sensor and a signal processing circuit which are connected in parallel with the potential dividing capacitor, are connected in series to the main capacitor.

The potential dividing capacitor may be composed of the drifting electrostatic capacitance 6 formed between the intermediate electrode 3 and the metallic vessel 1, and a mica or ceramics capacitor element.

It is also possible to use, as the main capacitor or the potential dividing capacitor, a capacitor element contained in a ceramics tube filled with an oil.

The optical voltage sensor may be made of any suitable element such as an element having an electro-optical effect, a polarizer, a quarter wavelength plate or an analyzer.

Figure 7:
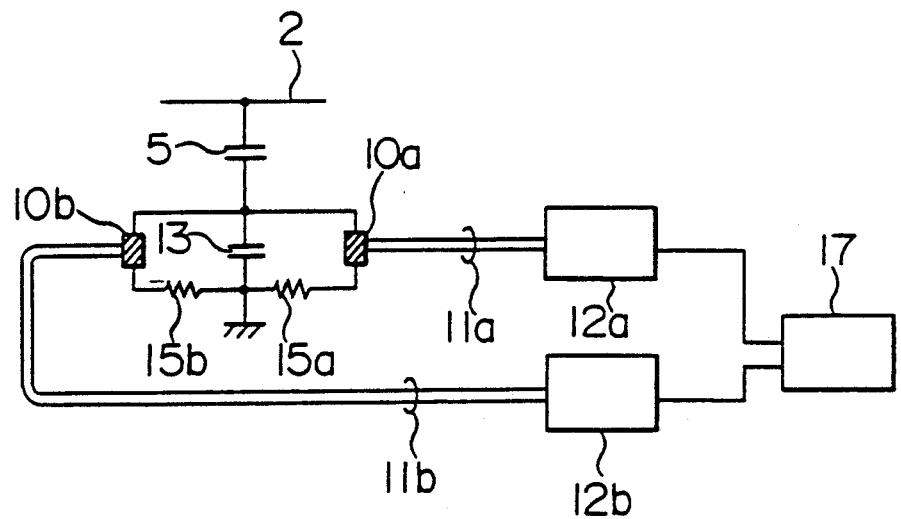
FIG. 7 is a schematic circuit diagram showing the construction of an embodiment of the optical transformer in accordance with the second aspect of the present invention.

A description will now be given of an embodiment of the second aspect of the present invention. Referring to FIG. 7, resistors 15a and 15b are connected in series to optical voltage sensors 10a and 10b, respectively. In this case, the optical voltage sensor 10a, the resistor 15a, the optical fiber 11a and the signal processing circuit 12a in combination form one unit of optical voltage detection means. In FIG. 7, the same reference numerals are used to denote the same parts or members as those appearing in FIGS. 2 and 3.

The operation of this embodiment is as follows. It is assumed here that a short circuit failure has taken place so that the voltage across the optical voltage sensor 10a is reduced to zero. In such a case, the light transmitted from the signal processing circuit 12a is returned to the signal processing circuit 12a without being substantially modulated in the optical voltage sensor 10a. Consequently, the signal processing circuit 12a produces an output which corresponds to the applied voltage which is in this case zero.

In this case, the voltage $E_2$ across the potential dividing capacitor 13 is not reduced to zero because of the presence of the resistor 15a connected to the sensor 10a. Namely, the voltage $E_2$ in this case is expressed by the following formula:

$$E_2 = \frac{1}{1 + \frac{C_2}{C_1} + \frac{1}{\omega C_1 R_a}} \cdot E_0$$

where, $C_1$ represents the electrostatic capacitance of the main capacitor 5, $C_2$ represents the electrostatic capacitance of the potential dividing capacitor 13, $R_1$ represents the resistance value of the resistor 15a, $E_0$ represents the voltage of the high-voltage conductor 2 and $\omega$ represents the angular frequency.

The voltage $E_{20}$ applied to the optical voltage sensor 10b is represented by the following formula:

$$E_{20} = \frac{Z_{b0}}{Z_{b0} + R_b} E_2$$

where, $Z_{b0}$ represents the self impedance of the optical voltage sensor 10b, and $R_b$ represents the resistance value of the resistor 15b.

It is therefore possible to obtain, from the second signal processing circuit 12b, an output corresponding to the voltage applied, whereby a difference is produced between the output of the first signal processing circuit 12a and that of the second signal processing circuit 12b. The level of the difference between the outputs of two signal processing circuits 12a and 12b can be set to a desired value by suitably setting the resistance values $R_a$ and $R_b$ of the resistors 15a and 15b.

Although the embodiment has been described on an assumption that the fault has taken place in the first optical voltage sensor 10a, it will be clear to those skilled in the art that the difference between the outputs of two optical voltage sensors occurs also when a trouble has taken place in the second optical voltage sensor 10b.

Figure 8:
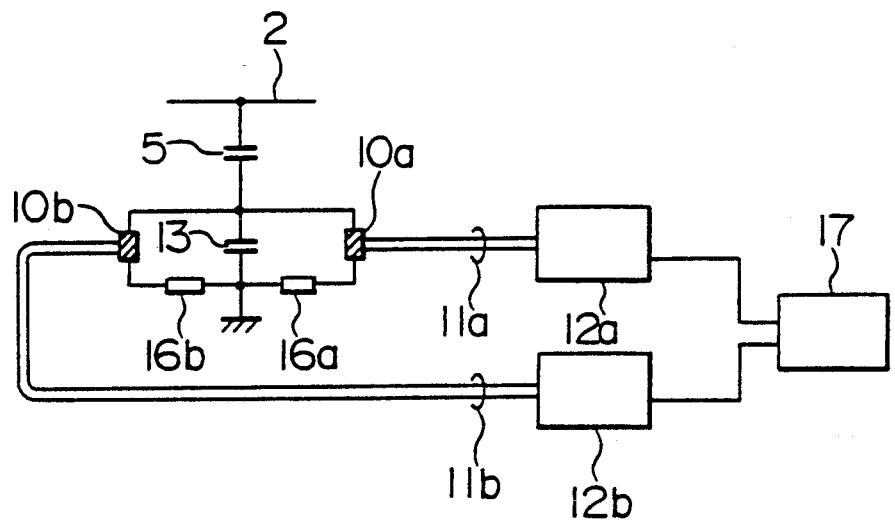
FIGS. 8 to 10 are schematic circuit diagrams showing the constructions of different embodiments of the optical transformer in accordance with the second aspect of the present invention.

In the embodiment described hereinbefore, a resistor is connected in series to the optical voltage sensor. This, however, is only illustrative and the same advantage is obtained when the resistor is substituted by a capacitor, an inductor or an impedance element having a combination thereof. FIG. 8 shows such an embodiment. In this Figure, numerals 16a and 16b denote impedance elements each of which is composed of a combination of a capacitor and an inductor, with or without a resistor.

Figure 9:
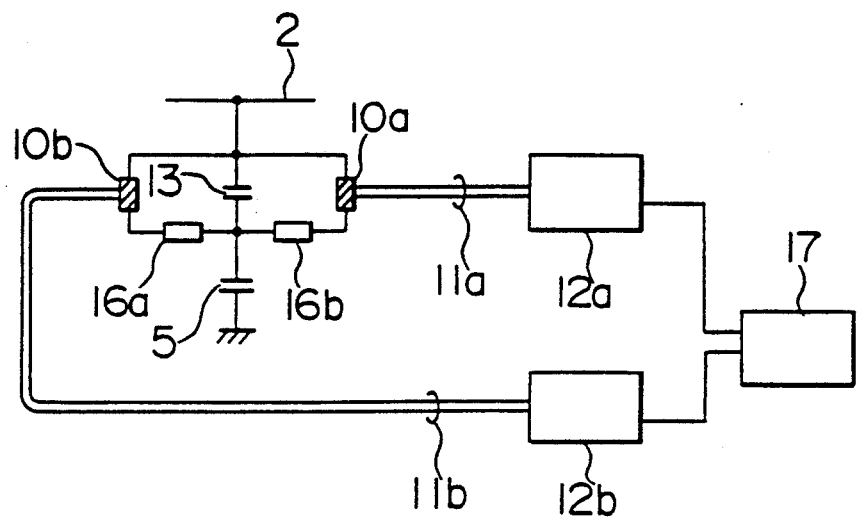

FIG. 9 shows a different embodiment in which the potential dividing capacitor 13 is connected between the intermediate electrode 3 and the high-voltage conductor 2. The advantages mentioned before can be obtained also in this case, provided that the impedance elements 16a and 16b are connected in series to the optical voltage sensors 10a and 10b, and thus formed two series connections are connected in parallel with the potential dividing capacitor 13 respectively.

Figure 10:
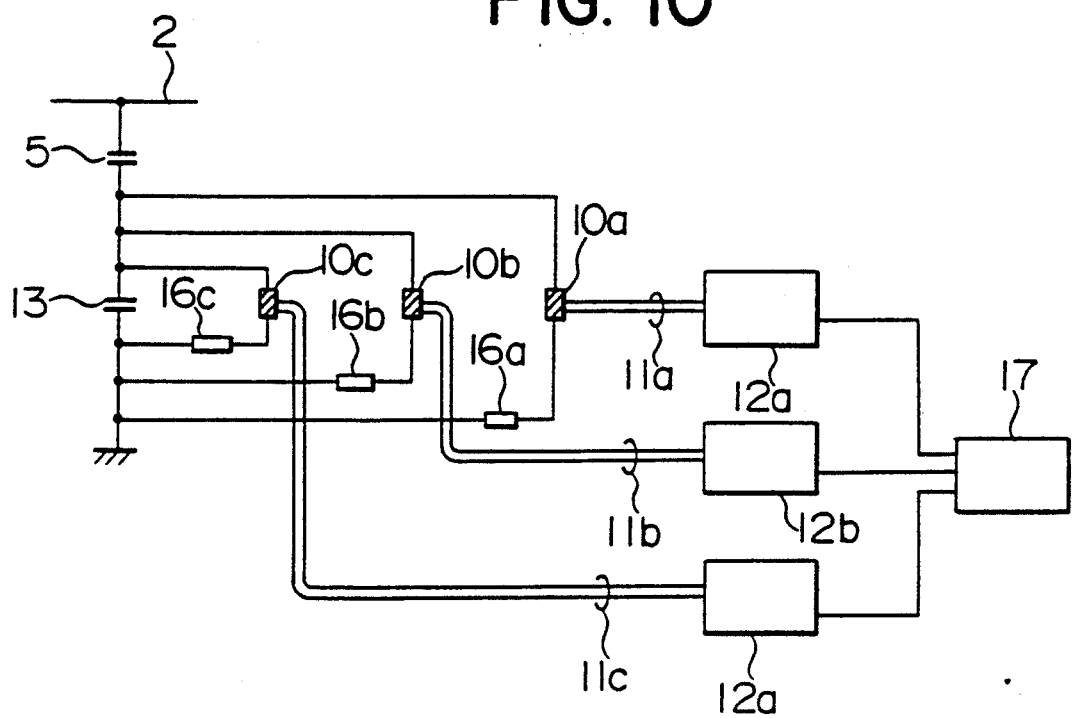

FIG. 10 shows a still different embodiment in which three or more optical voltage sensors 10a, 10b, 10c are used together with impedance elements 16a, 16b, 16c which are connected in series thereto.

As has been described, according to the first aspect of the present invention, at least two series-connected potential dividing capacitors, each having a optical voltage sensor connected in parallel therewith, are connected in series to a main capacitor. It is therefore possible to obtain a difference between the outputs of two or more signal processing circuits, the difference being used for the purpose of preventing erroneous operation of a relay connected thereto, not only when a fault has taken place in the signal processing circuit or the optical fiber connected thereto but also when a trouble such as cutting of the line or short-circuit failure has taken place in the optical voltage sensor.

The second aspect of the present invention also offers the same advantage, by virtue of the use of two or more circuits connected in parallel with a potential dividing capacitor, each circuit including an optical voltage sensor and an impedance element such as resistance connected in series to the optical voltage sensor.

What is claimed is:

1. An optical transformer for determining the voltage of a high-voltage conductor by making use of light, comprising:

an intermediate electrode provided between said high-voltage conductor and the ground and having an intermediate potential intermediate between the potential of said high-voltage conductor and the ground potential;

at least two potential dividing capacitors connected in series to each other between the ground and said high-voltage conductor for dividing said intermediate potetial of said intermediate electrode;

optical voltage detecting means provided for each of said potential dividing capacitors, each of said optical voltage detection means including an optical voltage sensor connected in parallel with one of said potential dividing capacitors and capable of generating a signal corresponding to the voltage at said potential dividing capacitor; and a fault detection circuit connected to said optical voltage detection means associated with one of potential dividing capacitor and capable of detecting difference between the outputs of these optical voltage detection means, thereby detecting occurrence of the fault;

whereby the fault is detected accurately even when the fault is a short circuit accident in one of said optical voltage sensors.

2. An optical transformer according to claim 1, wherein said at least two potential dividing capacitors connected in series are connected between said intermediate electrode and the ground.

3. An optical transformer according to claim 1, wherein said at least two potential dividing capacitors connected in series are connected between said high voltage conductor and said intermediate conductor.

4. An optical transformer for determining the voltage of a high-voltage conductor, comprising:

an intermediate electrode provided between said high-voltage conductor and the ground and having an intermediate potential intermediate between the potential of said high-voltage potential and the ground potential;

a single potential dividing capacitor connected between the ground and said high-voltage conductor for dividing said intermediate potential of said intermediate electrtode;

at least two sets of optical voltage detection means connected in parallel with said single potential dividing capacitor and capable of generating electrical signals representing the divided potentials at said potential dividing capacitor, each of at least two sets of said optical voltage detection means including an optical voltage sensor capable of generating a signal corresponding to the voltage at said potential dividing capacitor and an impedance element connected in series to said optical voltage sensor; and a fault detection circuit connected to each of said optical voltage detection means and capable of detecting difference between the electrical signals generated by each of said optical voltage detection means thereby detecting occurrence of a fault;

whereby the occurrence of the fault can be detected accurately even when the fault is a short circuit accident occurring in one of said optical voltage sensor.

5. An optical transformer according to claim 4, wherein said potential dividing capacitor is connected between said intermediate electrode and the ground.

6. An optical transformer according to claim 4, wherein said potential dividing capacitor is connected between said high-voltage conductor and said intermediate electrode.

7. An optical transformer according to claim 4, wherein said impedance element includes a resistor.

8. An optical transformer according to claim 4, wherein said impedance element includes one of a capacitor and an inductor.

9. An optical transformer according to claim 4, wherein said impedance element includes an impedance circuit having, in combination, a plurality of resistors, capacitors and inductors.

* * * * *

UNITED STATES PATENT AND TRADEMARK OFFICE
CERTIFICATE OF CORRECTION

Page 1 of 3

PATENT NO. : 5,059,910

DATED : October 22, 1991

INVENTOR(S) : Naoki Ochi

It is certified that error appears in the above-identified patent and that said Letters Patent is hereby corrected as shown below:

In item no. [57], Abstract, line 1, change "An" to --One embodiment of an--;

line 5, after "ground" insert --.--;

delete "and" (second occurrence);

change "optical" to --Optical--;

after "sensors" insert --are--;

line 7, after "and" insert --are--;

line 8, change "In another form, the" to --Another embodiment of an--;

line 12, after "ground" insert --.--;

change "and at" to --At--;

after "circuits" insert --are--.

Column 6, line 64, change "to" to --with--;
after "other" insert --and in series with said intermediate electrode--;
intermediate electrode--;

line 65, after "conductor" insert --;--;

lines 65 and 66, delete "for dividing said intermediate potential of said intermediate electrode;";

UNITED STATES PATENT AND TRADEMARK OFFICE
CERTIFICATE OF CORRECTION

PATENT NO. : 5,059,910

DATED : October 22, 1991

INVENTOR(S) : Naoki Ochi

It is certified that error appears in the above-identified patent and that said Letters Patent is hereby corrected as shown below:

Column 6, line 67, change "detecting" to --detection--.

Column 7, lines 7 and 8, delete "associated with one of potential dividing capacitor";

lines 8 and 9, after "detecting" insert --a--;

line 9, change "these" to --the--;

line 17, delete "connected in series";

line 21, delete "connected in series";

lines 21 and 22, change "high voltage" to --high-voltage--;

line 30, after "connected" insert --in series with the intermediate electrode--;

line 31, after "conductor" insert --;--;

lines 32 and 33, delete "for dividing said intermediate potential of said intermediate electrode;";

line 34, delete "sets of".

UNITED STATES PATENT AND TRADEMARK OFFICE
CERTIFICATE OF CORRECTION

PATENT NO. : 5,059,910

DATED : October 22, 1991

INVENTOR(S) : Naoki Ochi

It is certified that error appears in the above-identified patent and that said Letters Patent is hereby corrected as shown below:

Column 8, lines 3 and 4, delete "at least two sets of";

line 8, change "to" to --with--;

line 12, after "detecting" insert --a--.

Signed and Sealed this

Fourth Day of May, 1993

Attest:

MICHAEL K. KIRK

Attesting Officer

Acting Commissioner of Patents and Trademarks